United States Patent
Gonya et al.

(10) Patent No.: US 10,827,608 B2
(45) Date of Patent: *Nov. 3, 2020

(54) CONFORMAL 3D NON-PLANAR MULTI-LAYER CIRCUITRY

(71) Applicant: LOCKHEED MARTIN CORPORATION, Bethesda, MD (US)

(72) Inventors: Stephen Gonya, Endicott, NY (US); Kenn Twigg, Sayre, PA (US); Jim Patterson, Owego, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/351,250

(22) Filed: Mar. 12, 2019

(65) Prior Publication Data

US 2019/0215955 A1    Jul. 11, 2019

Related U.S. Application Data

(60) Division of application No. 15/876,552, filed on Jan. 22, 2018, now Pat. No. 10,568,204, which is a (Continued)

(51) Int. Cl.
*H05K 1/11* (2006.01)
*H05K 1/05* (2006.01)
(Continued)

(52) U.S. Cl.
CPC ............ *H05K 1/0298* (2013.01); *H05K 1/09* (2013.01); *H05K 1/115* (2013.01); *H05K 3/4644* (2013.01);
(Continued)

(58) Field of Classification Search
None
See application file for complete search history.

(56) References Cited

U.S. PATENT DOCUMENTS

| 4,574,331 A | 3/1986 | Smolley |
| 4,859,188 A | 8/1989 | Neumann |

(Continued)

FOREIGN PATENT DOCUMENTS

| EP | 1020874 A1 | 7/2000 |
| EP | 1840964 A1 | 10/2007 |

(Continued)

OTHER PUBLICATIONS

Nonfinal Rejection dated Jan. 31, 2014, in U.S. Appl. No. 13/527,180.
(Continued)

*Primary Examiner* — Shamim Ahmed
(74) *Attorney, Agent, or Firm* — Baker Botts L.L.P.

(57) ABSTRACT

A method for making conformal non-planar multi-layer circuitry is described. The method can include providing a substrate having a non-planar surface and depositing a first conformal dielectric layer on the substrate, the first conformal dielectric layer conforming to the non-planar surface of the substrate and having a non-planar surface. The method can also include applying a first conformal circuitry layer on the first conformal dielectric layer. The method can include depositing a second conformal dielectric layer on the first conformal circuitry layer, the second conformal dielectric layer conforming to a non-planar surface of the first conformal circuitry layer, and applying a second conformal circuitry layer on the second conformal dielectric layer. Successive layers can be sequentially deposited.

7 Claims, 7 Drawing Sheets

Related U.S. Application Data continuation of application No. 14/993,197, filed on Jan. 12, 2016, now Pat. No. 9,894,760, which is a division of application No. 13/570,365, filed on Aug. 9, 2012, now Pat. No. 9,258,907.

(51) Int. Cl.
*H05K 3/00* (2006.01)
*H05K 1/02* (2006.01)
*H05K 3/46* (2006.01)
*H05K 1/09* (2006.01)

(52) U.S. Cl.
CPC .......... *H05K 1/0284* (2013.01); *H05K 1/053* (2013.01); *H05K 2201/09018* (2013.01); *H05K 2203/0315* (2013.01)

(56) References Cited

U.S. PATENT DOCUMENTS

| | | |
|---|---|---|
| 4,940,623 A | 7/1990 | Bosna et al. |
| 5,286,417 A | 2/1994 | Mahmoud et al. |
| 5,315,481 A | 5/1994 | Smolley |
| 5,368,883 A | 11/1994 | Beaver |
| 5,427,304 A | 6/1995 | Woods et al. |
| 5,608,434 A | 3/1997 | Wilson et al. |
| 5,738,797 A | 4/1998 | Belke, Jr. et al. |
| 5,938,455 A | 8/1999 | Glovatsky et al. |
| 6,100,200 A | 8/2000 | Van Buskirk et al. |
| 6,188,582 B1 | 2/2001 | Peter |
| 6,198,630 B1 | 3/2001 | Cromwell |
| 6,264,476 B1 | 7/2001 | Li et al. |
| 6,370,770 B1 | 4/2002 | Fan et al. |
| 6,386,890 B1 | 5/2002 | Bhatt et al. |
| 6,574,114 B1 | 6/2003 | Brindle et al. |
| 6,593,900 B1 | 7/2003 | Craven |
| 6,695,623 B2 | 2/2004 | Brodsky et al. |
| 7,188,282 B2 | 3/2007 | Walmsley |
| 7,302,592 B2 | 11/2007 | Shipton et al. |
| 7,815,475 B2 | 10/2010 | Peloza et al. |
| 8,686,522 B2 | 4/2014 | Webb |
| 8,772,745 B1 | 7/2014 | Gonya et al. |
| 8,878,072 B2 | 11/2014 | Gonya et al. |
| 8,880,139 B1 | 11/2014 | Etzkorn et al. |
| 8,963,316 B2 | 2/2015 | Hsu et al. |
| 9,087,617 B2 | 7/2015 | Gonya et al. |
| 9,258,907 B2 | 2/2016 | Gonya et al. |
| 9,263,400 B2 | 2/2016 | Gonya et al. |
| 9,515,030 B2 | 12/2016 | Gonya et al. |
| 9,894,760 B2 | 2/2018 | Gonya et al. |
| 2002/0098721 A1 | 7/2002 | Fan et al. |
| 2004/0074088 A1 | 4/2004 | Nakamura et al. |
| 2004/0157370 A1 | 8/2004 | Gardner |
| 2004/0199786 A1 | 10/2004 | Walmsley |
| 2004/0227205 A1 | 11/2004 | Walmsley |
| 2008/0113505 A1 | 5/2008 | Sparks et al. |
| 2008/0173698 A1 | 7/2008 | Marczi et al. |
| 2008/0244898 A1 | 10/2008 | Shacklette et al. |
| 2010/0031064 A1 | 2/2010 | Walmsley |
| 2010/0213590 A1 | 8/2010 | Warren et al. |
| 2010/0230806 A1 | 9/2010 | Huang et al. |
| 2010/0255312 A1 | 10/2010 | Dougherty et al. |
| 2011/0031982 A1 | 2/2011 | Leon et al. |
| 2011/0049684 A1 | 3/2011 | Lee et al. |
| 2011/0090658 A1 | 4/2011 | Adams et al. |
| 2011/0120764 A1 | 5/2011 | Kelley et al. |
| 2011/0227603 A1 | 9/2011 | Leon et al. |
| 2011/0233766 A1 | 9/2011 | Lin et al. |
| 2012/0146182 A1 | 6/2012 | Oganesian et al. |
| 2012/0185636 A1 | 7/2012 | Leon et al. |
| 2013/0026645 A1 | 1/2013 | Mohammed et al. |
| 2013/0093032 A1 | 4/2013 | Webb |
| 2013/0207260 A1 | 8/2013 | Hsu et al. |
| 2013/0256835 A1 | 10/2013 | Di Sarro et al. |
| 2013/0292835 A1 | 11/2013 | King et al. |
| 2016/0105970 A1 | 4/2016 | Gonya et al. |
| 2016/0128185 A1 | 5/2016 | Gonya et al. |
| 2016/0338192 A1 | 11/2016 | Gonya et al. |
| 2017/0084356 A1 | 3/2017 | Gonya et al. |

FOREIGN PATENT DOCUMENTS

| | | |
|---|---|---|
| WO | 2010057145 A1 | 5/2010 |
| WO | 2011046769 A1 | 4/2011 |
| WO | 2012123400 A1 | 9/2012 |

OTHER PUBLICATIONS

Notice of Allowance dated Jul. 6, 2014, in U.S. Appl. No. 13/527,180.
Nonfinal Rejection dated Oct. 2, 2014, U.S. Appl. No. 14/325,670.
Notice of Allowance dated Mar. 17, 2015, in U.S. Appl. No. 14/325,670.
Nonfinal Office Action dated Aug. 14, 2015, in U.S. Appl. No. 14/789,885.
Notice of Allowance dated Sep. 23, 2015, in U.S. Appl. No. 13/570,365.
Notice of Allowance dated Oct. 1, 2015, in U.S. Appl. No. 14/789,885.
Nonfinal Office Action dated Mar. 24, 2016, in U.S. Appl. No. 15/014,160.
Notice of Allowance dated Jul. 28, 2016, in U.S. Appl. No. 15/014,160.
Nonfinal Office Action dated Aug. 23, 2016, in U.S. Appl. No. 14/511,549.
Nonfinal Office Action dated Sep. 2, 2016, in U.S. Appl. No. 15/222,333.
Nonfnal Office Action dated Oct. 13, 2016, in U.S. Appl. No. 14/993,197.
Final Rejection dated Dec. 21, 2016, in U.S. Appl. No. 14/511,549.
Final Rejection dated Dec. 21, 2016, in U.S. Appl. No. 15/222,333.
Nonfinal Office Action dated Mar. 14, 2017, in U.S. Appl. No. 15/367,642.
Final Office Action dated Mar. 23, 2017, in U.S. Appl. No. 14/993,197.
Advisory Action dated Mar. 27, 2017, in U.S. Appl. No. 15/222,333.
Advisory Action dated Mar. 28, 2017, in U.S. Appl. No. 14/511,549.
Nonfinal Office Action dated Apr. 28, 2017, in U.S. Appl. No. 15/222,333.
Nonfinal Office Action dated May 1, 2017, in U.S. Appl. No. 14/511,549.
Notice of Allowance dated Jul. 6, 2017, in U.S. Appl. No. 15/367,642.
Advisory Action dated Jul. 10, 2017, in U.S. Appl. No. 14/993,197.
Notice of Allowance dated Oct. 4, 2017, in U.S. Appl. No. 14/993,197.
Non Final Office Action dated Oct. 12, 2017, in U.S. Appl. No. 15/222,333.
Non Final Office Action dated Oct. 13, 2017, in U.S. Appl. No. 14/511,549.
Final Office Action dated Feb. 20, 2018, in U.S. Appl. No. 14/511,549.
Non-Final Office Action dated Apr. 2, 2018, in U.S. Appl. No. 15/222,333.
Notice of Allowance dated Jul. 6, 2018, in U.S. Appl. No. 14/511,549.
Notice of Allowance dated Aug. 3, 2018, in U.S. Appl. No. 15/222,333.
Notice of Allowance dated Oct. 17, 2019 in U.S. Appl. No. 15/876,552.
Non-Final Office Action dated May 1, 2019, in U.S. Appl. No. 15/876,552.

CONFORMAL 3D NON-PLANAR MULTI-LAYER CIRCUITRY

This application is a divisional of U.S. application Ser. No. 15/876,552 know U.S. patent Ser. No. 10/568,204) filed on Jan. 22, 2018, which is a continuation of U.S. application Ser. No. 14/993,197 (now U.S. Pat. No. 9,894,760) filed on Jan. 12, 2016, which is a divisional of U.S. application Ser. No. 13/570,365 (now U.S. Pat. No. 9,258,907) filed on Aug. 9, 2012.

Embodiments relate generally to electronics circuitry and, more particularly, to conformal 3D non-planar multi-layer circuitry.

Conventional approaches to printed circuit boards (or printed wiring boards) often use rigid, planar substrates.

Weight or volume constraints may limit the use of rigid printed circuit boards in certain applications. Also, mechanical envelope requirements may limit use of planar circuit boards. A need may exist for multi-layer circuitry that conforms to a non-planar 3D surface.

Embodiments were conceived in light of the above problems and limitations of some conventional circuitry types, among other things.

One embodiment includes a method for making conformal non-planar multi-layer circuitry. The method can include providing a substrate having a non-planar surface and depositing a first conformal dielectric layer on the substrate, the first conformal dielectric conforming to the non-planar surface of the substrate and having a non-planar surface. The method can also include applying a first conformal circuitry layer on the first conformal dielectric layer, such that the first conformal circuitry layer conforms to the non-planar surface of the first conformal dielectric, the first conformal circuitry layer having a non-planar surface. The method can further include depositing a second conformal dielectric layer on the first conformal circuitry layer, the second conformal dielectric layer conforming to the non-planar surface of the first conformal circuitry layer, and applying a second conformal circuitry layer on the second conformal dielectric layer. Successive layers can be sequentially deposited to build up a multilayer circuit structure using microvias between circuit layers for electrical connections.

One embodiment includes a method for making non-planar, multi-layer circuitry. The method can include providing a substrate having a non-planar surface and depositing a first conformal dielectric layer on the non-planar surface of the substrate via vapor deposition, the first conformal dielectric conforming to the non-planar surface of the substrate and having a non-planar surface. The method can also include applying a first conformal circuitry layer on the first conformal dielectric layer, such that the first conformal circuitry layer conforms to the non-planar surface of the first conformal dielectric, the first conformal circuitry layer having a non-planar surface and including a first seed layer and a first conductor layer. The method can further include depositing a second conformal dielectric layer on the first conformal circuitry layer, the second conformal dielectric layer conforming to the non-planar surface of the first conformal circuitry layer. The method can also include applying a second conformal circuitry layer on the second conformal dielectric layer, the second conformal circuitry layer including a second seed layer and a second conductor layer.

Applying the first conformal circuitry layer can include applying the first seed layer on the first conformal dielectric layer and applying the first conductor layer on the first seed layer. Applying the first conformal circuitry layer can also include depositing resist material on the first conductor layer and etching the resist material to reveal portions of the first conductor layer and the first seed layer to be etched away. Applying the first conformal circuitry layer can further include etching the first conductor layer, etching the first seed layer, removing remaining resist material, and then filling and leveling any cavities or voids created during the etching of the first conductor layer and the first seed layer (e.g., using an epoxy solder mask material). Each of the first and second seed layers can include an alloy having chrome and copper. Each of the first and second conductor layers can include copper.

In one embodiment, applying the second conformal circuitry layer can include drilling vias in the second conformal dielectric layer. The drilling can be performed using a laser.

The non-planar surface of the first conformal dielectric layer can be etched to roughen the non-planar surface of the first conformal dielectric layer. The etching can be performed using oxygen plasma etching. Etching the resist can include laser imaging or ablation.

One embodiment includes a conformal non-planar multi-layer circuit comprising a substrate having a first non-planar surface and a first conformal dielectric layer on the substrate, the first conformal dielectric conforming to the first non-planar surface of the substrate and having a second non-planar surface. The circuit can also include a first conformal circuitry layer applied on the first conformal dielectric layer, the first conformal circuitry layer conforming to the second non-planar surface of the first conformal dielectric, the first conformal circuitry layer having a third non-planar surface. The circuit can further include a second conformal dielectric layer deposited on the first conformal circuitry layer, the second conformal dielectric layer conforming to the third non-planar surface of the first conformal circuitry layer and having a fourth non-planar surface. The circuit can also include a second conformal circuitry layer applied on the second conformal dielectric layer, the second conformal circuitry layer conforming to the fourth non-planar surface of the second conformal dielectric, the second conformal circuitry layer having a fifth non-planar surface. Successive layers can then be sequentially deposited to build up a multilayer circuit structure using microvias between circuit layers for electrical connections.

DETAILED DESCRIPTION

In general, deposition processes and lithographic laser patterning are used to sequentially build up layers of copper circuitry on non-planar surfaces, including angled and curved surfaces. The non-planar, multi-layer circuitry can be formed on a variety of substrate materials including metallic, ceramic, and/or plastic substrates.

The non-planar, multi-layer circuitry can be used to build, for example, conformal antennas, conformal circuitry over enclosure structures, power circuitry built directly on heat sinking frames, and functional circuitry residing in a non-planar object, such as a helmet.

Figure 1:
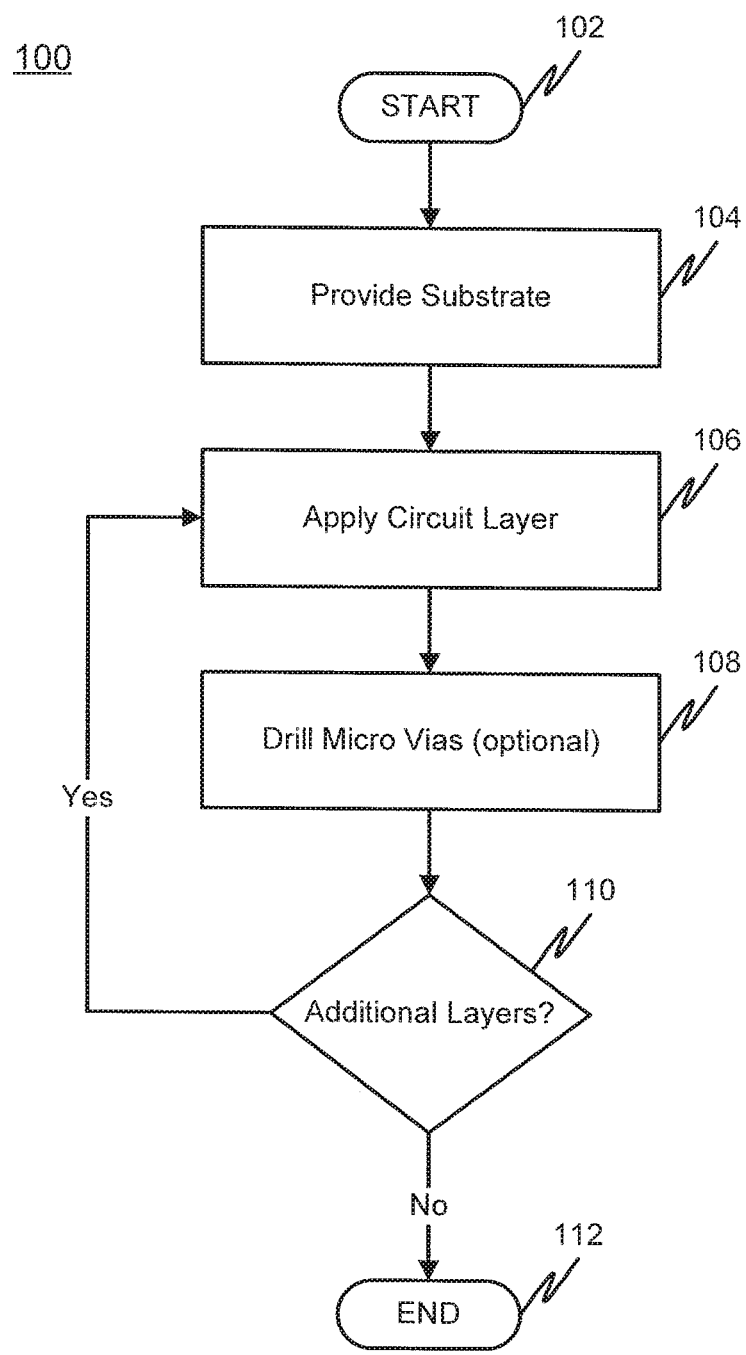
FIG. 1 is a chart showing an exemplary method for making non-planar multi-layer circuitry in accordance with at least one embodiment.

FIG. 1 shows an exemplary method 100 for making non-planar multi-layer circuitry. The method 100 starts at 102 and continues to 104.

At 104, a substrate is provided. The substrate can be a substrate having a non-planar 3D surface (e.g., an anodized aluminum component). Processing continues to 106.

At 106, a circuit layer is applied to the substrate. An example of the preparation of the substrate and application of a circuit layer is described in greater detail below in conjunction with FIG. 2. Processing continues to 108.

At 108, micro vias are drilled. Micro vias can be used to connect one circuit layer to another circuit layer. The drilling of micro vias is optional and depends on a contemplated circuit design. The micro vias can be drilled with a laser. Processing continues to 110.

At 110, it is determined whether additional circuit layers are needed. If so, processing continues to 106. If not, processing continues to 112, where the process ends.

Figure 2:
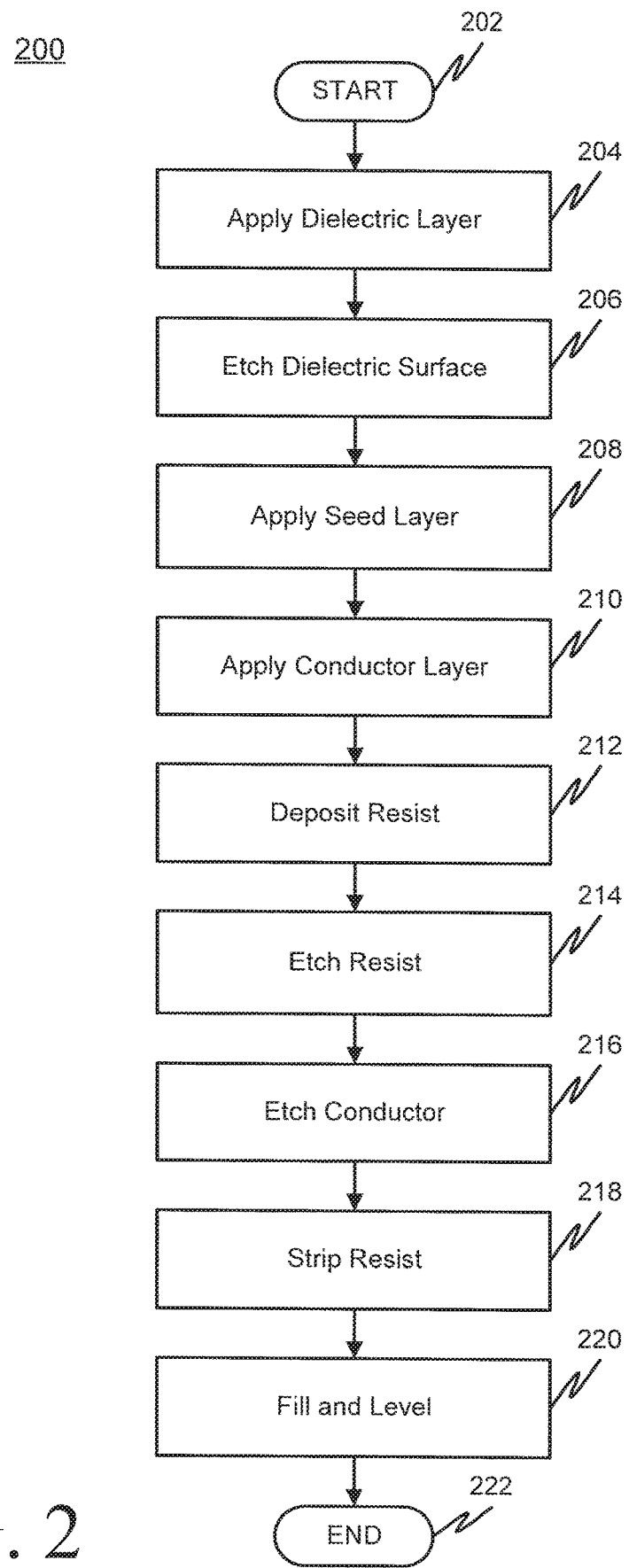
FIG. 2 is a chart showing an exemplary method for making non-planar multi-layer circuitry in accordance with at least one embodiment.

FIG. 2 is a chart showing an exemplary method for making non-planar multi-layer circuitry in accordance with at least one embodiment. The method begins at 202 and continues to 204.

At 204, a dielectric layer is applied. When the first circuit layer is being formed, the dielectric layer can be applied to a substrate. For subsequent circuit layers, the dielectric is deposited on the preceding circuit layer. The dielectric can be applied using a vapor deposition process. For example, the dielectric layer can be formed from Parylene HT at a thickness of about 2 mils. Parylene HT is available from Specialty Coating Systems of Indianapolis, Ind. Other suitable dielectric materials can be used. The process continues to 206.

At 206, the surface of the dielectric layer is etched. The etching is done to roughen the surface of the dielectric for better adhesion with subsequent layers. The etching can be done using oxygen plasma. Other etching techniques can be used. The process continues to 208.

At 208, a seed layer of metal is applied. For example, the seed layer can include a chrome/copper (Cr/Cu) alloy applied using sputtering to a thickness of about 1 micron. The process continues to 210.

At 210 the conductor layer is applied. For example, the conductor layer can include copper applied using sputtering and/or electroplating to a thickness of about half a mil (12.7 microns). The process continues to 212.

At 212, a layer of resist material is deposited. The resist material can include any suitable resist material that can resist the etching solutions used to etch the conductor layer and the seed layer. The process continues to 214.

At 214, the resist material is imaged or etched with the circuit pattern. The patterning of the resist material can be performed using a laser. For example, a laser can be used to pattern channels in the resist to facilitate conductor layer etching for fabrication of circuit lines and spaces down to about 3 mils wide. The process continues to 216.

At 216, the conductor and seed layers are etched using etching solutions appropriate to etch the material of each layer. The process continues to 218.

At 218, the resist material is removed (or stripped). The process continues to 220.

At 220, any cavities or voids created during the etching process are filled. For example, the spaces between lines can be filled with an epoxy solder mask material. The process continues to 222 where the process ends. It will be appreciated that 202-222 can be repeated for each layer of a multi-layer circuit. In a multi-layer circuit, the dielectric material applied on top of a preceding layer can be drilled to form micro vias that permit the conductor of a next layer to connect with the conductor of the preceding layer. The drilling could occur, for example, between 206 and 208.

FIGS. 3-6 are diagrams showing cross sections of various stages of an exemplary non-planar multi-layer circuit being made in accordance with at least one embodiment.

Figure 3:
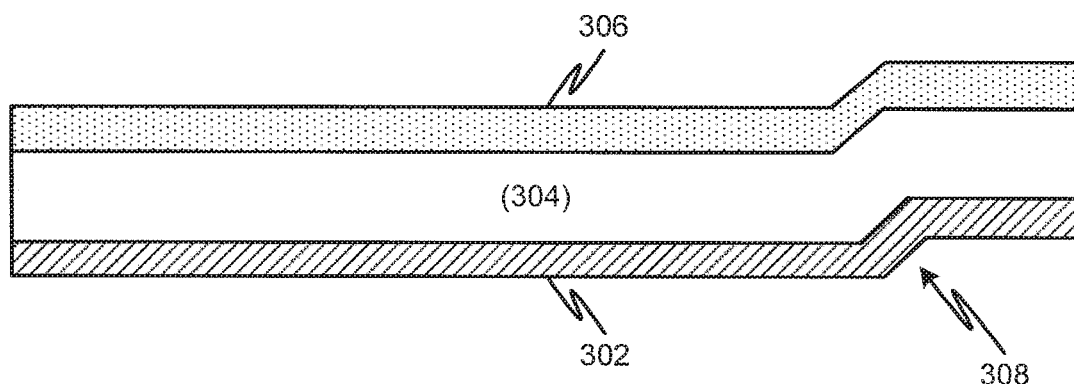
FIGS. 3-7 are diagrams showing cross sections of various stages of an exemplary non-planar multi-layer circuit being made in accordance with at least one embodiment.
Figure 4:
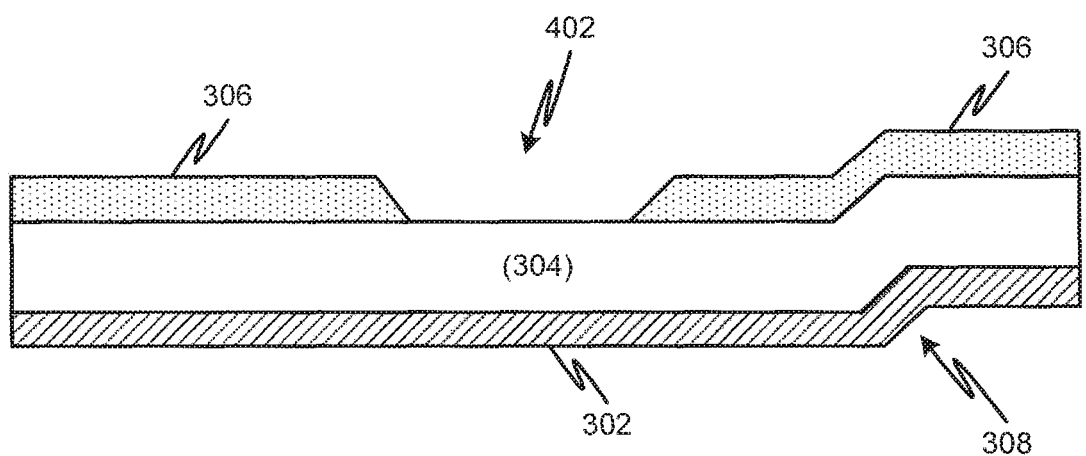
Figure 7:
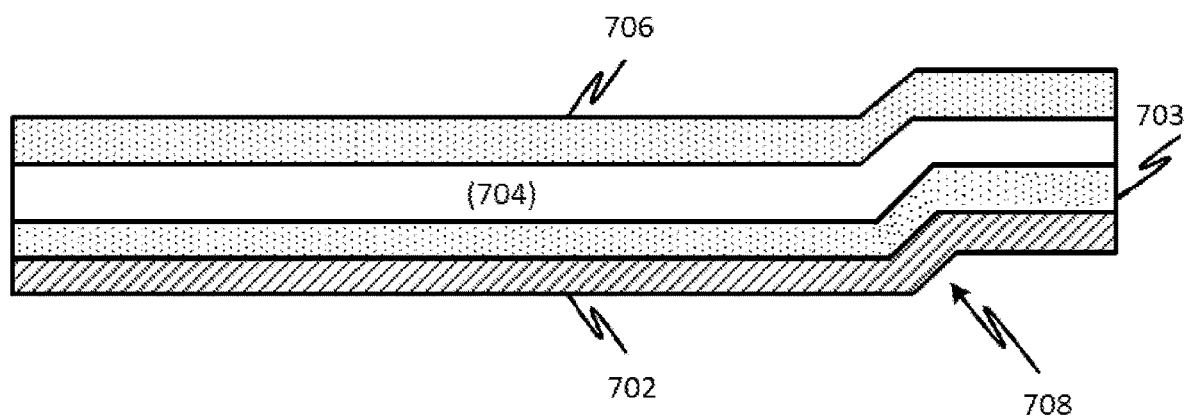

FIGS. 3 and 7 each show an exemplary section of a partially built circuit 300 or 700 having a substrate layer 302 or 702, a first circuit layer 304 or 704 and a dielectric layer 306 or 706. The substrate has a non-planar feature 308 or 708 resulting in a non-planar top surface. Depending on the type of substrate and a contemplated design, a dielectric layer can be applied to the top surface of the substrate. The dielectric layer can conform to the substrate and have a top surface with a non-planar feature that corresponds to the non-planar feature 308 of the substrate.

The first circuit layer 304 can be applied directly to the substrate 302 or to a dielectric layer (e.g., dielectric layer 703 in FIG. 7) applied to the substrate. The first circuit layer 304 conforms to the underlying layer and takes on a non-planar shape and has a top surface that is non-planar. The next dielectric layer 306 is applied on top of the first circuit layer 304 and conforms to the non-planar top surface of the first circuit layer 304 and has a non-planar top surface.

Prior to applying a next circuit layer, a micro via (402 in FIG. 4) can be drilled through the dielectric layer 306. The micro via can be drilled using a laser or other suitable technique.

Figure 5:
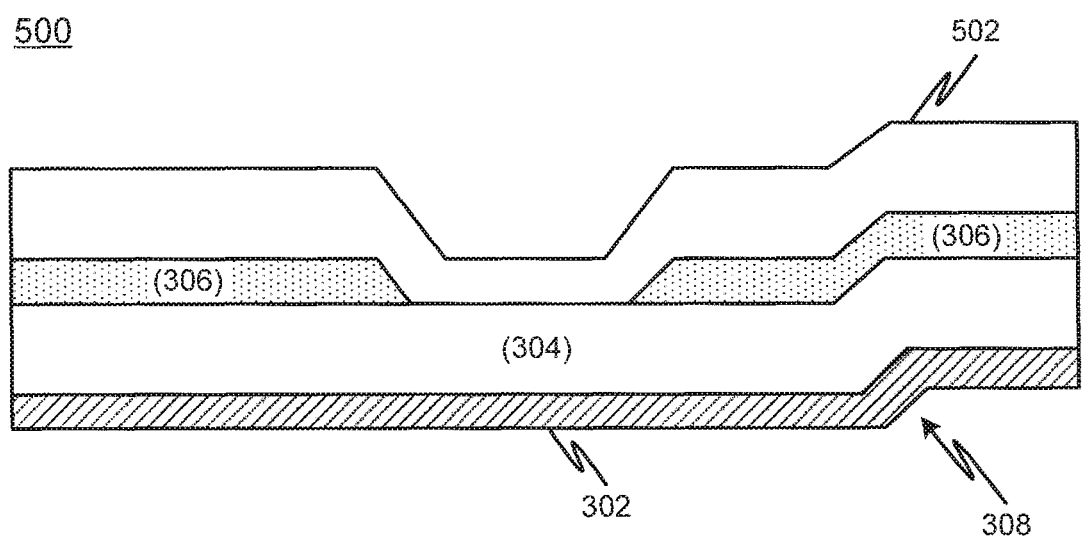
Figure 6:
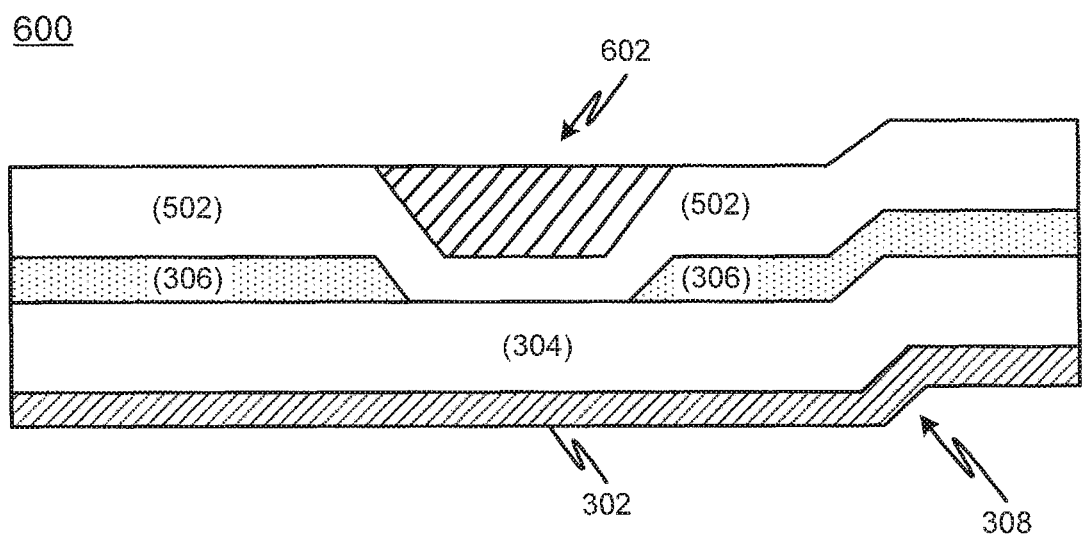

As shown in FIG. 5, when a second circuit layer 502 is applied to the circuitry 500, the second circuit layer 502 connects with the first circuit layer 304 where the micro via 402 was drilled. Also, the second circuit layer 502 conforms to the non-planar top surface of the dielectric layer 306 and has a top surface that is non-planar. As described above, a circuit layer can include a seed layer and a conductor layer.

Any voids created while forming the circuit layers (e.g., the void where micro via 402 was drilled) can be filled and leveled (602 of FIG. 6) using, for example, an epoxy solder mask material. The resulting circuitry 600 is multi-layer (e.g., 304 and 502), conformal and non-planar.

It is, therefore, apparent that there is provided, in accordance with the various embodiments disclosed herein, conformal 3D non-planar multi-layer circuits and methods for making the same.

While the invention has been described in conjunction with a number of embodiments, it is evident that many alternatives, modifications and variations would be or are apparent to those of ordinary skill in the applicable arts. Accordingly, Applicants intend to embrace all such alternatives, modifications, equivalents and variations that are within the spirit and scope of the invention.

What is claimed is:
1. A method of forming a multi-layer circuit, comprising:
providing a substrate having a first non-planar surface;
forming a conformal circuitry layer over the substrate, the conformal circuitry layer conforming to the first non-planar surface of the substrate, and the conformal circuitry layer having a second non-planar surface;
forming a copper circuitry layer over the conformal circuitry layer, the copper circuitry layer conforming to the second non-planar surface of the conformal circuitry layer, and the copper circuitry layer having a third non-planar surface;

depositing a first conformal dielectric layer over the substrate, the first conformal dielectric layer conforming to the first non-planar surface of the substrate and the first conformal dielectric layer having a fourth non-planar surface; and drilling at least one micro via into the first conformal dielectric layer, the at least one micro via exposing the conformal circuitry layer, wherein the copper circuitry layer contacts the conformal circuitry layer through the at least one micro via.

2. The method of claim 1, further comprising:

depositing a second conformal dielectric layer over the copper circuitry layer, the second conformal dielectric layer conforming to the third non-planar surface of the copper circuitry layer, and the second conformal dielectric layer having a fourth non-planar surface.

3. The method of claim 2, wherein the depositing the second conformal dielectric layer includes performing a vapor deposition process until the second conformal dielectric layer has a thickness of about 2 mils.

4. The method of claim 1, wherein the forming of the conformal circuitry layer includes sputtering or electroplating a chromium-copper alloy layer over the substrate.

5. The method of claim 4, wherein the chromium-copper alloy layer has a thickness of about 1 micron.

6. The method of claim 1, wherein the forming of the copper circuitry layer includes sputtering or electroplating a chromium-copper alloy layer over the conformal circuitry layer.

7. The method of claim 1, wherein at least one of the conformal circuitry layer and the copper circuitry layer has a thickness of about 12.7 microns.

* * * * *